(12) United States Patent
Yu

(10) Patent No.: US 11,825,691 B2
(45) Date of Patent: Nov. 21, 2023

(54) DISPLAY PANEL AND WATER-ABSORBING MAGNETIC NANOPARTICLES

(71) Applicant: BOE Technology Group Co., Ltd., Beijing (CN)

(72) Inventor: Donghui Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 588 days.

(21) Appl. No.: 15/824,605

(22) Filed: Nov. 28, 2017

(65) Prior Publication Data
US 2018/0301512 A1 Oct. 18, 2018

(30) Foreign Application Priority Data

Apr. 17, 2017 (CN) .......................... 201710249924.9

(51) Int. Cl.
*H01L 29/08* (2006.01)
*H10K 59/00* (2023.01)
(Continued)

(52) U.S. Cl.
CPC ........... *H10K 59/00* (2023.02); *H10K 50/841* (2023.02); *H10K 50/846* (2023.02);
(Continued)

(58) Field of Classification Search
CPC ......... H01L 51/5246; H01L 2251/5369; H01L 51/524; H01L 51/5259; H01L 51/5237;
(Continued)

(56) References Cited

U.S. PATENT DOCUMENTS

| 6,624,568 B2 * | 9/2003 | Silvernail ........... H01L 51/5237 313/504 |
| 7,321,714 B2 * | 1/2008 | Ingman ................ G02B 6/0229 385/147 |

(Continued)

FOREIGN PATENT DOCUMENTS

| CN | 104124268 A | 10/2014 |
| CN | 203983342 U | 12/2014 |

(Continued)

OTHER PUBLICATIONS

Office Action for Chinese Appl. No. 201710249924.9, dated Feb. 24, 2018.

*Primary Examiner* — Ismail A Muse
(74) *Attorney, Agent, or Firm* — ArentFox Schiff LLP; Michael Fainberg

(57) ABSTRACT

Embodiments of the present disclosure disclose a display panel and a fabricating method thereof. In the solution, on one hand, water-absorbing magnetic nanoparticles in a packaging layer are distributed along a direction perpendicular to the cover plate at a side far away from an OLED component, or distributed along an extension direction of the packaging layer at a periphery of a region in which the OLED component is located, thus reducing the damage to the OLED component of a display substrate. On the other hand, since the water-absorbing magnetic nanoparticles have magnetic property, the water-absorbing magnetic nanoparticles can be doped in the packaging layer material in a packaging and waterproofing process, and a magnetic field is applied to induce the magnetic nanoparticles to move to the side far away from the OLED component or to the periphery of the region in which the OLED component is located.

16 Claims, 5 Drawing Sheets

(51) Int. Cl.
- *H10K 50/84* (2023.01)
- *H10K 50/842* (2023.01)
- *H10K 71/00* (2023.01)
- *H10K 102/00* (2023.01)

(52) U.S. Cl.
CPC ......... *H10K 50/8426* (2023.02); *H10K 71/00* (2023.02); *H10K 2102/331* (2023.02)

(58) Field of Classification Search
CPC . H01L 51/5243; H01L 51/5253; H01L 51/56; H01L 27/32
See application file for complete search history.

(56) References Cited

U.S. PATENT DOCUMENTS

| | | | | |
|---|---|---|---|---|
| 8,242,688 | B2* | 8/2012 | Kwon | H01L 51/524 |
| | | | | 313/504 |
| 8,932,632 | B2* | 1/2015 | Yadav | C03C 27/10 |
| | | | | 156/284 |
| 9,493,348 | B2* | 11/2016 | Ramadas | B82Y 20/00 |
| 9,825,254 | B2* | 11/2017 | Wang | H01L 51/5262 |
| 10,069,102 | B2* | 9/2018 | Lee | H01L 51/5256 |
| 10,103,359 | B2* | 10/2018 | Ramadas | B82Y 30/00 |
| 10,164,204 | B2* | 12/2018 | Chen | H01L 27/322 |
| 10,590,291 | B2* | 3/2020 | Frantz | C09D 4/00 |
| 2007/0036510 | A1* | 2/2007 | Ingman | C09D 7/70 |
| | | | | 385/147 |
| 2007/0172971 | A1* | 7/2007 | Boroson | H01L 51/5246 |
| | | | | 438/26 |
| 2010/0089636 | A1* | 4/2010 | Ramadas | B82Y 15/00 |
| | | | | 174/521 |
| 2010/0294024 | A1* | 11/2010 | Kumar | B82Y 20/00 |
| | | | | 73/38 |
| 2011/0069370 | A1* | 3/2011 | Patry | G02F 1/161 |
| | | | | 359/267 |
| 2011/0114991 | A1 | 5/2011 | Lee | |
| 2011/0132449 | A1* | 6/2011 | Ramadas | H05B 33/10 |
| | | | | 428/419 |
| 2011/0280280 | A1* | 11/2011 | Kochergin | G01K 11/32 |
| | | | | 374/161 |
| 2012/0326189 | A1* | 12/2012 | Lee | H01L 51/5218 |
| | | | | 257/98 |
| 2013/0193842 | A1* | 8/2013 | Hoshina | H05B 33/04 |
| | | | | 313/504 |
| 2013/0319529 | A1* | 12/2013 | Tsuda | H01L 31/18 |
| | | | | 438/93 |
| 2014/0147659 | A1* | 5/2014 | Chun | G02F 1/1339 |
| | | | | 428/327 |
| 2014/0154820 | A1* | 6/2014 | Oh | H01L 51/5246 |
| | | | | 438/26 |
| 2014/0179040 | A1* | 6/2014 | Ramadas | B32B 27/20 |
| | | | | 438/27 |
| 2014/0264297 | A1* | 9/2014 | Kumar | H01L 51/5253 |
| | | | | 257/40 |
| 2014/0322827 | A1* | 10/2014 | Su | H01L 51/56 |
| | | | | 438/3 |
| 2016/0001263 | A1* | 1/2016 | Thevasahayam | B01J 20/28026 |
| | | | | 252/194 |
| 2016/0293886 | A1 | 10/2016 | Yu et al. | |
| 2016/0359131 | A1* | 12/2016 | Gao | H01L 51/5246 |
| 2017/0077450 | A1* | 3/2017 | Kim | H01L 51/44 |
| 2017/0110682 | A1 | 4/2017 | Yu et al. | |
| 2017/0294630 | A1* | 10/2017 | Hero | H01L 27/3239 |
| 2017/0297919 | A1* | 10/2017 | Byun | C01F 5/22 |
| 2018/0212195 | A1* | 7/2018 | Xu | H01L 51/5243 |
| 2019/0351416 | A1* | 11/2019 | Culbertson | B01L 3/50273 |

FOREIGN PATENT DOCUMENTS

| | | |
|---|---|---|
| CN | 104091890 A | 11/2015 |
| CN | 105161630 A | 12/2015 |
| CN | 106449553 A | 2/2017 |

* cited by examiner

DISPLAY PANEL AND WATER-ABSORBING MAGNETIC NANOPARTICLES

CROSS-REFERENCE TO RELATED APPLICATIONS

This application claims the priority to Chinese Patent Application No. 201710249924.9, field on Apr. 17, 2017, the content of which is hereby incorporated by reference in its entirety.

FIELD

The present disclosure relates to the technical field of displaying, in particular to a display panel and a fabricating method thereof.

BACKGROUND

As a new display technology, Organic Light-Emitting Diodes (OLEDs) have been paid more and more attention. However, for OLED displays, the intrusion of water and oxygen seriously affects the performance and service life of a device. In the prior art, in order to enhance the packaging effect, a water-absorbing material is usually added to a packaging material coated in the space between a cover plate and a display substrate, but the water-absorbing material tends to cause damage to the device for the following reasons: firstly when the water-absorbing particles react with water, trace gas or heat may be released (e.g., heat is released by CaO), the OLED in direct contact with it may be bombarded, resulting in dark spots; secondly the water-absorbing particles which are rough in surface are evenly distributed in the coated packaging material, and when the packaging material is cured to cause volume change, the particles close to the OLED may crush the OLED under the effect of an external pressure. Therefore, coating is performed several times in general. For example, in the conventional double-layer coating solution, when the packaging material is coated on the substrate of the OLED, an ordinary material is coated at the first layer by Ink Jet Printing (IJP) and then is cured; a water-absorbing material is coated at the second layer and then is pressed for packaging. In this way, although the water-absorbing material is far away from the OLED to reduce the damage to the OLED, the two times of coating increases the process complexity.

SUMMARY

An embodiment of the present disclosure provides a display panel having a display region and a sealant region surrounding the display region. The display panel includes: a display substrate including an OLED component in the display region, a cover plate opposite to the display substrate, a sealant in the sealant region between the display substrate and the cover plate, and a packaging layer including water-absorbing magnetic nanoparticles and in the display region between the display substrate and the cover plate. The water-absorbing magnetic nanoparticles are spaced apart from the OLED component.

A fabricating method of the above display panel, includes: forming a sealant in a sealant region of a display substrate or a cover plate to be packaged, where an OLED component is arranged in a display region of the display substrate; coating a packaging layer material in a region surrounded by the sealant, where the packaging layer material includes water-absorbing magnetic nanoparticles; aligning the display substrate and the cover plate, and applying a magnetic field to induce the water-absorbing magnetic nanoparticles to move along a direction perpendicular to the cover plate to a side far away from the OLED component; and curing the sealant and the packaging layer material.

DETAILED DESCRIPTION OF THE EMBODIMENTS

In order to solve the above technical problem, embodiments of the present disclosure provide a display panel and a fabricating method thereof. A display panel according to an embodiment of the present disclosure has a display region and a sealant region surrounding the display region, where the display panel includes a cover plate, a display substrate provided with an OLED component, a sealant disposed in the sealant region between the display substrate and the cover plate, and a packaging layer disposed in the display region between the display substrate and the cover plate; where the OLED component is disposed in the display region; water-absorbing magnetic nanoparticles in the packaging layer are distributed along a direction perpendicular to the cover plate at a side far away from the OLED component, or distributed along the extension direction of the packaging layer at the periphery of a region in which the OLED component is located.

In the embodiment of the present disclosure, on one hand, water-absorbing magnetic nanoparticles in the packaging layer are distributed along a direction perpendicular to the cover plate at a side far away from the OLED component, or distributed along the extension direction of the packaging layer at the periphery of a region in which the OLED component is located, thus realizing packaging and waterproofing dual functions of the packaging layer. In addition, the distribution of the water-absorbing magnetic nanoparticles at the side far away from the OLED component or at the periphery of a region in which the OLED component is located reduces the damage to the OLED component of the display substrate. On the other hand, since the water-absorbing magnetic nanoparticles have magnetic property, the water-absorbing magnetic nanoparticles can be doped in the packaging layer material in a package and waterproofing process, and a magnetic field is applied to induce the magnetic nanoparticles to move to the side far away from the OLED component or to the periphery of the region in which the OLED component is located, it is only necessary to coat the packaging layer material doped with the water-absorbing magnetic nanoparticles once. Compared with the prior art in which coating is performed twice, the solution of the present disclosure is simple in process and is reduced in the process complexity.

Detailed description of the technical solution according to the present disclosure is set forth as embodiments with reference to accompanying drawings.

Figure 1:
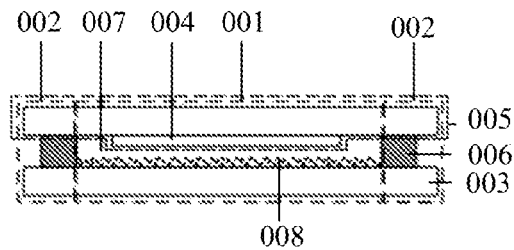
FIG. 1 is a schematic diagram of the structure of a display panel according to an embodiment of the present disclosure.
Figure 2:
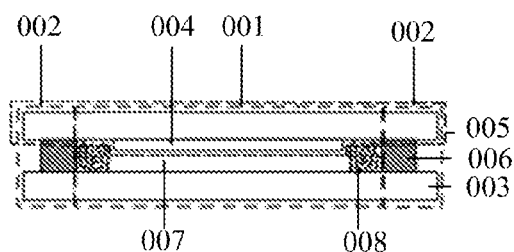
FIG. 2 is a schematic diagram of the structure of another display panel according to an embodiment of the present disclosure.

As shown in FIGS. 1 and 2, the display panel according to the embodiment of the present disclosure has a display region 001 and a sealant region 002 surrounding the display region, where the display panel includes a cover plate 003, a display substrate 005 provided with an OLED component 004, a sealant 006 disposed in the sealant region 002 between the display substrate 005 and the cover plate 003, and a packaging layer 007 disposed in the display region 001 between the display substrate 005 and the cover plate 003. The OLED component 004 is disposed in the display region 001. Water-absorbing magnetic nanoparticles 008 in the packaging layer 007 are distributed along a direction perpendicular to the cover plate at a side far away from the OLED component 004, as shown in FIG. 1, or distributed along the extension direction of the packaging layer at the periphery of the region in which the OLED component 004 is located, as shown in FIG. 2, that is, an orthographic projection of the water-absorbing magnetic nanoparticles on the cover plate lies between the orthographic projections of the sealant and the OLED component on the cover plate.

Figure 3:
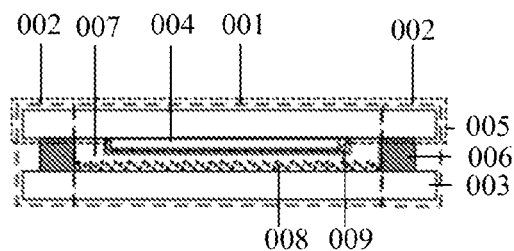
FIG. 3 is a schematic diagram of the structure of yet another display panel according to an embodiment of the present disclosure.

Optionally, as shown in FIG. 3, the surface of the OLED component on the display substrate is covered with a passivation layer 009, and the passivation layer may be made of a material having a water/oxygen barrier effect, for example, $Si_3N_4$, $SiO_2$, SiC, $TiO_2$, $Al_2O_3$, ZnS, ZnO and other materials, and its thickness ranges from 500 nm to 1000 nm. The passivation layer may be formed by Chemical Vapor Deposition (CVD), sputtering, Atomic Layer Deposition (ALD), spraying, and the like.

Optionally, the packaging layer material may be, but is not limited to, photo-curable or thermosetting resins, and an acrylic material.

In a specific implementation, a certain amount of the water-absorbing magnetic nanoparticles 008 are doped in the packaging layer material. The doping amount of the water-absorbing magnetic nanoparticles 008 may influence the packaging and waterproof effect to some degree. If too many water-absorbing magnetic nanoparticles are doped, the difficulty of the magnetic field adsorption is increased; if too little water-absorbing magnetic nanoparticles are doped, the waterproof effect cannot be reached. In order to ensure a better packaging and waterproof effect, optionally the volume fraction of the water-absorbing magnetic nanoparticles in the packaging layer material ranges from 10% to 20%.

In a specific implementation, the water-absorbing magnetic nanoparticles have many types of nanostructures. Optionally, each of the water-absorbing magnetic nanoparticles includes a core structure and a shell structure, or is a nanotube.

Optionally, the particle size of each of the water-absorbing magnetic nanoparticles ranges from 1 nm to 50 nm.

For the water-absorbing magnetic nanoparticle including a core structure and a shell structure, the particle size refers to shell diameter. For the water-absorbing magnetic nanoparticle with a nanotube structure, the particle size refers to tube diameter.

In implementation, a proper nano composite material is selected according to a specific nanostructure. For example, if each of the water-absorbing magnetic nanoparticles includes a core structure and a shell structure, the material of the core structure is a magnetic metal nanoparticle and the material of the shell structure is a water-absorbing material. For another example, if each of the water-absorbing magnetic nanoparticles is a nanotube, the main material of the nanotube is a metallic oxide and is compounded with a water-absorbing material.

The water-absorbing material is a material having an excellent water absorbing function, for example, the water-absorbing material may be, but not limited to, calcium oxide or water-absorbing resins, or the like.

The magnetic metal nanoparticle is a metal nanoparticle with excellent magnetic property, for example, the magnetic metal nanoparticle may be, but not limited to, magnetic Au, Al or Mg, or the like.

The metallic oxide material may be, but not limited to, ferric oxide, nickel oxide and cobalt oxide.

Figure 4:
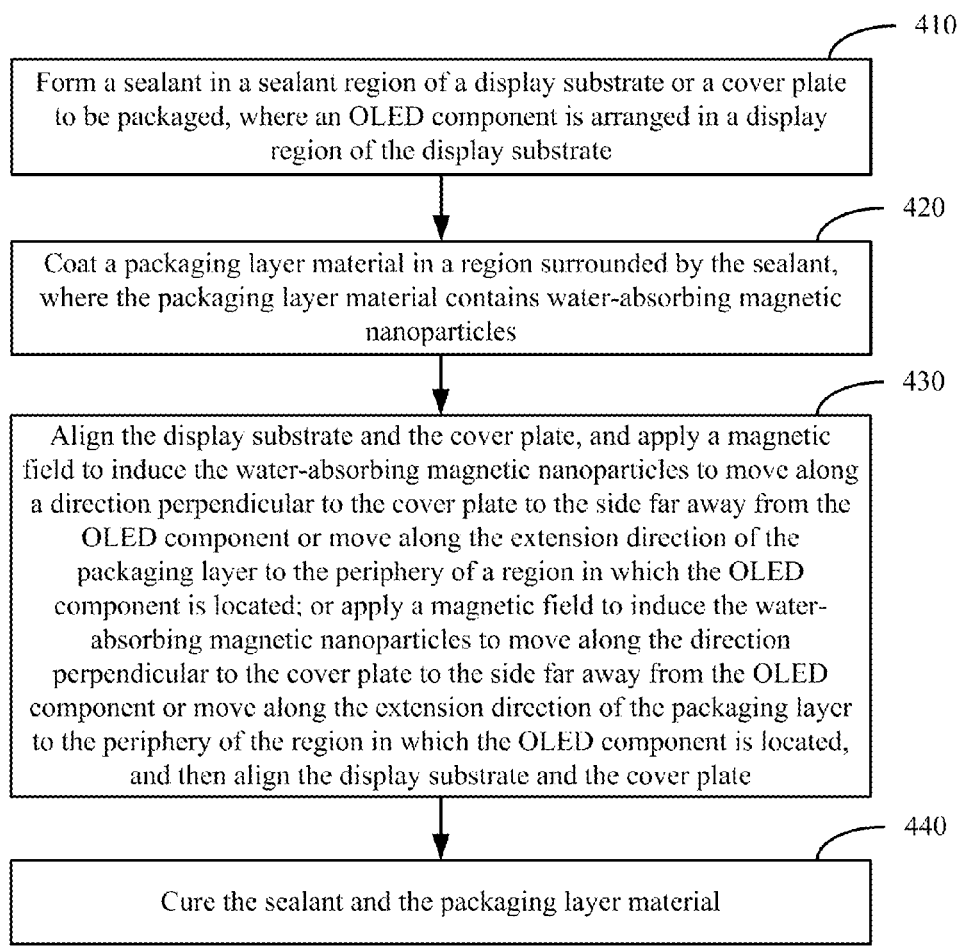
FIG. 4 is a flow chart of a fabricating method of a display panel according to an embodiment of the present disclosure.

Based on the same inventive concept, an embodiment of the present disclosure further provides a fabricating method of the display panel according to any of the above embodiments, as shown in FIG. 4, the method at least includes the following steps.

Step 410 is to form a sealant in a sealant region of a display substrate or a cover plate to be packaged, where an OLED component is arranged in a display region of the display substrate.

Step 420 is to coat a packaging layer material in a region surrounded by the sealant, where the packaging layer material contains water-absorbing magnetic nanoparticles.

In this step, if the sealant is formed on the cover plate, then the packaging layer material is coated on the cover plate. If the sealant is formed on the display substrate, then the packaging layer material is coated on the display substrate.

Step 430 is to align the display substrate and the cover plate, and apply a magnetic field to induce the water-absorbing magnetic nanoparticles to move along a direction perpendicular to the cover plate to the side far away from the OLED component or move along the extension direction of the packaging layer to the periphery of a region in which the OLED component is located; or apply a magnetic field to induce the water-absorbing magnetic nanoparticles to move along the direction perpendicular to the cover plate to the side far away from the OLED component or move along the extension direction of the packaging layer to the periphery of the region in which the OLED component is located, and then align the display substrate and the cover plate.

Step 440 is to cure the sealant and the packaging layer material.

In the embodiment of the present disclosure, on one hand, water-absorbing magnetic nanoparticles in the packaging layer are distributed along a direction perpendicular to the cover plate at a side far away from the OLED component, or distributed along the extension direction of the packaging layer at the periphery of a region in which the OLED component is located, thus realizing packaging and water-proofing dual functions of the packaging layer. In addition, the distribution of the water-absorbing magnetic nanoparticles at the side far away from the OLED component or at the periphery of a region in which the OLED component is located reduces the damage to the OLED component of the display substrate. On the other hand, since the water-absorbing magnetic nanoparticles have magnetic property, the water-absorbing magnetic nanoparticles can be doped in the packaging layer material in a package and waterproofing process, and a magnetic field is applied to induce the magnetic nanoparticles to the side far away from the OLED component or to the periphery of the region in which the OLED component is located, it is only necessary to coat the packaging layer material doped with the water-absorbing magnetic nanoparticles once. Compared with the prior art in which coating is performed twice, the solution of the present disclosure is simple in process and is reduced in the process complexity.

In a specific implementation, optionally, the fabricating method of the display panel, according to the embodiment of the present disclosure, further includes: removing the magnetic field after curing the sealant and the packaging layer material.

Or removing the magnetic field before curing the sealant and the packaging layer material.

In this embodiment, there are two opportunities to remove the magnetic field, and if the magnetic field is removed after curing, the position of the water-absorbing magnetic nanoparticles has been fixed after curing, and the water-absorbing magnetic nanoparticles can be prevented from bouncing. If the magnetic field is removed before the curing, the water-absorbing magnetic nanoparticles may bounce back due to the abrupt disappearance of the acting force. In order to avoid this situation, optionally the magnetic field is removed before the sealant and the packaging layer material are cured and the specific implementation can be: weakening the magnetic field step by step. Optionally, the step-by-step weakening of the magnetic field can be implemented by weakening the magnetic field by a preset percentage of an initial value of the magnetic field each time and maintaining it for a preset period of time, until the magnetic field is completely removed. For example, the magnetic field can be weakened by 10% of the initial value of the magnetic field each time and the weakened magnetic field is maintained for 10 s, until the magnetic field is completely removed. The magnetic field may also be weakened in other ways, which will not be numerated one by one.

According to the final distribution position of the water-absorbing magnetic nanoparticles, it is necessary to apply magnetic fields in different directions to play an inducing function. In a specific implementation, optionally, applying a magnetic field to induce the magnetic nanoparticles to move to the side far away from the OLED component may be implemented in a way of applying a magnetic field departing from the OLED component in a direction perpendicular to the cover plate to induce the water-absorbing magnetic nanoparticles to move to the side far away from the OLED component. Applying a magnetic field to induce the water-absorbing magnetic nanoparticles to move along a direction perpendicular to the cover plate to the periphery of a region in which the OLED component is located is implemented in a way of applying, along the extension direction of the packaging layer, a magnetic field departing from the region in which the OLED component is located to induce the water-absorbing magnetic nanoparticles to move to the periphery of the region in which the OLED component is located.

In a specific implementation, optionally the actual parameters of the magnetic field can be controlled according to the actual demand. In this embodiment, the intensity of the applied magnetic field ranges from 50 to 2000 Gs, and the applying time is not higher than 60 s.

The detail description of the fabricating method of the display panel according to the embodiment of the present disclosure will be set forth taking a specific structure of the display panel as an example.

In this embodiment, taking the structure of the display panel as shown in FIG. 1 as an example, based on the structure, this embodiment provides two alternative fabricating methods, one of which includes the following steps.

Figure 5A:
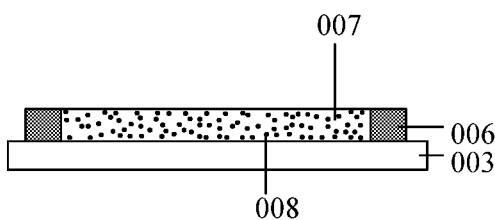
FIG. 5A is a first structural schematic diagram in the fabricating process of a display panel according to an embodiment of the present disclosure.

In a first step, as shown in FIG. 5A, the cover plate 003 is coated with the sealant 006 and the packaging layer 007 material doped with the water-absorbing magnetic nanoparticles 008 by means of dispenser coating, IJP coating, coating and the like.

Figure 5B:
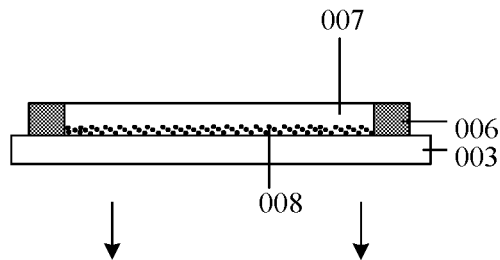
FIG. 5B is a second structural schematic diagram in the fabricating process of a display panel according to an embodiment of the present disclosure.

In a second step, the coated cover plate 003 is conveyed into a cavity with a weak magnetic field, where the direction of the magnetic field departs from the OLED component along the direction perpendicular to the cover plate and is toward the cover plate 003 (as shown by the arrow in FIG. 5B), and the magnetic field is achieved by arranging a magnetic field generating device on a carrier table of the cover plate 003. The magnetic field with the intensity of 50 to 2000 Gs is maintained for 60 s or less, as show in FIG. 5B, to induce the water-absorbing magnetic nanoparticles 008 to move away from the OLED component to one side of the cover plate 003 so that the water-absorbing magnetic nanoparticles 008 are distributed at the side close to the cover plate 003.

In a third step, the magnetic field is removed. After the water-absorbing magnetic nanoparticles are induced to move by the magnetic field, the magnetic field is weakened step by step and this operation is completed by setting the magnetic field device. The magnetic field is weakened by 10% of the initial value of the magnetic field each time and then is maintained for 10 s, until the magnetic field is completely removed.

In a fourth step, the cover plate 003 with the water-absorbing magnetic nanoparticles moved and the display substrate 005 having the OLED component 004 are pressed in vacuum.

In a fifth step, the pressed sealant 006 and the packaging layer 007 material are cured with ultraviolet (UV) or by heating to obtain the structure as shown in FIG. 1.

The other fabricating method includes the following steps.

Figure 6A:
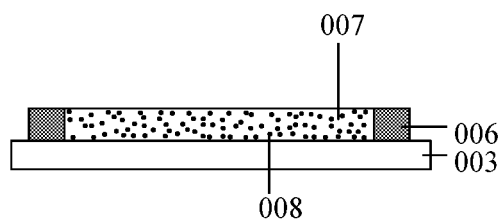
FIG. 6A is a first structural schematic diagram in the fabricating process of another display panel according to an embodiment of the present disclosure.

In a first step, as shown in FIG. 6A, the cover plate 003 is coated with the sealant 006 and the packaging layer 007 material doped with the water-absorbing magnetic nanoparticles 008 by means of dispenser coating, IJP coating, coating and the like.

Figure 6B:
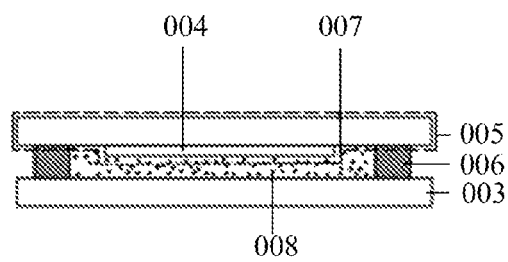
FIG. 6B is a second structural schematic diagram in the fabricating process of another display panel according to an embodiment of the present disclosure.

In a second step, as shown in FIG. 6B, the coated cover plate 003 and the display substrate 005 having the OLED component are pressed in vacuum.

Figure 6C:
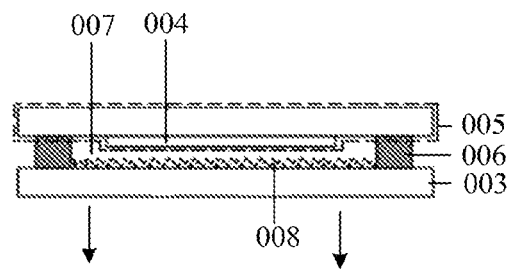
FIG. 6C is a third structural schematic diagram in the fabricating process of another display panel according to an embodiment of the present disclosure.

In a third step, the pressed cover plate 003 and the display substrate 005 are conveyed into a cavity with a weak magnetic field, where the direction of the magnetic field departs from the OLED component along the direction perpendicular to the cover plate and is toward the cover plate 003 (as shown by the arrow in FIG. 6C), and the magnetic field is achieved by arranging a magnetic field generating device on a carrier table of the cover plate 003. The magnetic field with the intensity of 50 to 2000 Gs is maintained for 60 s or less, as show in FIG. 6C, to induce the water-absorbing magnetic nanoparticles 008 to move away from the OLED component 004 to one side of the cover plate 003 so that the water-absorbing magnetic nanoparticles 008 are distributed at the side close to the cover plate 003.

In a fourth step, the magnetic field is removed. After the water-absorbing magnetic nanoparticles are induced to move by the magnetic field, the magnetic field is weakened step by step and this operation is completed by setting the magnetic field device. The magnetic field is weakened by 10% of the initial value of the magnetic field each time and then is maintained for 10 s, until the magnetic field is completely removed.

In a fifth step, the pressed sealant 006 and the packaging layer 007 material are cured with UV or by heating to obtain the structure as shown in FIG. 1.

In this embodiment, the structure of the display panel as shown in FIG. 2 is described as an example. Where the display panel is an OLED display panel. Based on the structure, this embodiment provides two alternative fabricating methods, one of which includes the following steps.

Figure 7A:
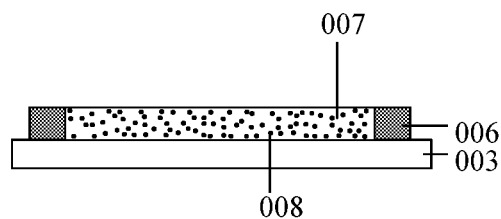
FIG. 7A is a first structural schematic diagram in the fabricating process of yet another display panel according to an embodiment of the present disclosure.

In a first step, as shown in FIG. 7A, the cover plate 003 is coated with the sealant 006 and the packaging layer 007 material doped with the water-absorbing magnetic nanoparticles 008 by means of dispenser coating, IJP coating, coating and the like.

Figure 7B:
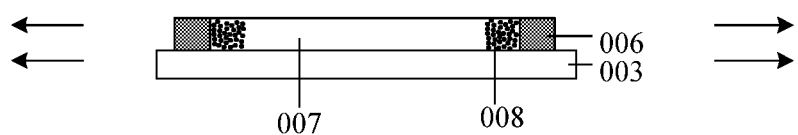
FIG. 7B is a second structural schematic diagram in the fabricating process of yet another display panel according to an embodiment of the present disclosure.

In a second step, the coated cover plate 003 is conveyed into a cavity with a weak magnetic field, where the direction of the magnetic field departs from a region where the OLED component 004 is located along the extension direction of the packaging layer (as shown by the arrow in FIG. 7B), and the magnetic field is achieved by arranging a magnetic field generating device on a carrier table of the cover plate 003. The magnetic field with the intensity of 50 to 2000 Gs is maintained for 60 s or less, as show in FIG. 7B, to induce the water-absorbing magnetic nanoparticles 008 to move to the periphery of the region where the OLED component 004 is located so that the water-absorbing magnetic nanoparticles 008 are distributed at the periphery of the region where the OLED component 004 is located.

In a third step, the magnetic field is removed. After the water-absorbing magnetic nanoparticles are induced to move by the magnetic field, the magnetic field is weakened step by step and this operation is completed by setting the magnetic field device. The magnetic field is weakened by 10% of the initial value of the magnetic field each time and then is maintained for 10 s, until the magnetic field is completely removed.

In a fourth step, the coated cover plate 003 and the display substrate 005 having the OLED component 004 are pressed in vacuum.

In a fifth step, the pressed sealant 006 and the packaging layer 007 material are cured with UV or by heating to obtain the structure as shown in FIG. 2.

The other fabricating method includes the following steps.

Figure 8A:
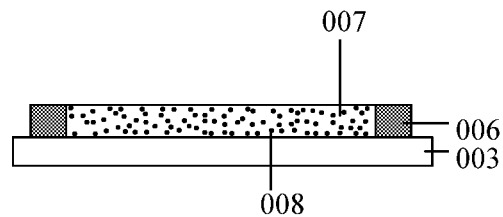
FIG. 8A is a first structural schematic diagram in the fabricating process of further yet another display panel according to an embodiment of the present disclosure.

In a first step, as shown in FIG. 8A, the cover plate 003 is coated with the sealant 006 and the packaging layer 007 material doped with the water-absorbing magnetic nanoparticles 008 by means of dispenser coating, IJP coating, coating and the like.

Figure 8B:
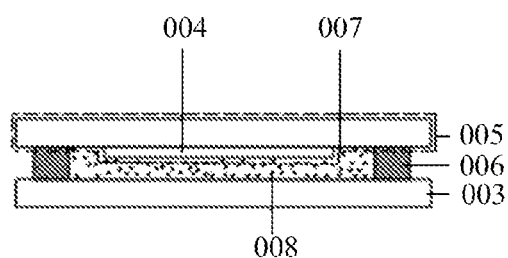
FIG. 8B is a second structural schematic diagram in the fabricating process of further yet another display panel according to an embodiment of the present disclosure.

In a second step, as shown in FIG. 8B, the coated cover plate 003 and the display substrate 005 having the OLED component 004 are pressed in vacuum.

Figure 8C:
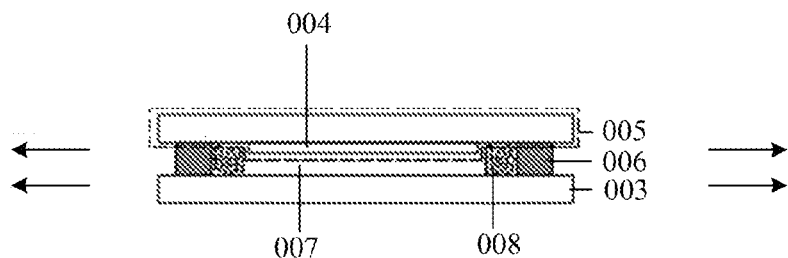
FIG. 8C is a third structural schematic diagram in the fabricating process of further yet another display panel according to an embodiment of the present disclosure.

In a third step, the pressed cover plate 003 and the display substrate 005 are conveyed into a cavity with a weak magnetic field, where the direction of the magnetic field departs from a region where the OLED component 004 is located along the extension direction of the packaging layer (as shown by the arrow in FIG. 8C), and the magnetic field is achieved by arranging a magnetic field generating device on a carrier table of the cover plate 003. The magnetic field with the intensity of 50 to 2000 Gs is maintained for 60 s or less, as show in FIG. 8C, to induce the water-absorbing magnetic nanoparticles 008 to move to the periphery of the region where the OLED component 004 is located so that the water-absorbing magnetic nanoparticles 008 are distributed at the periphery of the region where the OLED component 004 is located.

In a fourth step, the magnetic field is removed. After the water-absorbing magnetic nanoparticles are induced to move by the magnetic field, the magnetic field is weakened step by step and this operation is completed by setting the magnetic field device. The magnetic field is weakened by 10% of the initial value of the magnetic field each time and then is maintained for 10 s, until the magnetic field is completely removed.

In a fifth step, the pressed sealant 006 and the packaging layer 007 material are cured with UV or by heating to obtain the structure as shown in FIG. 2.

In the display method and its fabricating method according to embodiments of the present disclosure, on one hand, water-absorbing magnetic nanoparticles in the packaging layer are distributed along a direction perpendicular to the cover plate at a side far away from the OLED component, or distributed along the extension direction of the packaging layer at the periphery of a region in which the OLED component is located, thus realizing packaging and waterproofing dual functions of the packaging layer. In addition, the distribution of the water-absorbing magnetic nanoparticles at the side far away from the OLED component or at the periphery of a region in which the OLED component is located reduces the damage to the OLED component of the display substrate. On the other hand, since the water-absorbing magnetic nanoparticles have magnetic property, the water-absorbing magnetic nanoparticles can be doped in the packaging layer material in a packaging and waterproofing process, and a magnetic field is applied to induce the magnetic nanoparticles to the side far away from the OLED component or to the periphery of the region in which the OLED component is located, it is only necessary to coat the packaging layer material doped with the water-absorbing magnetic nanoparticles once. Compared with the prior art in which coating is performed twice, the solution of the present disclosure is simple in process and is reduced in the process complexity.

It will be apparent to those skilled in the art that various changes and modifications can be made in the present disclosure without departing from the spirit and scope of the present disclosure. In this manner, the present disclosure is intended to incorporate such modifications and variations if the modifications and variations of the present disclosure are within the scope of the appended claims of the present disclosure and the equivalents thereof.

The invention claimed is:

1. A display panel having a display region and a sealant region surrounding the display region, the display panel comprising:
   a display substrate comprising an OLED component in the display region;
   a cover plate opposite to the display substrate;
   a sealant in the sealant region between the display substrate and the cover plate; and
   a packaging layer comprising water-absorbing magnetic nanoparticles and in the display region between the display substrate and the cover plate; wherein
   the water-absorbing magnetic nanoparticles are inside the packaging layer, and the water-absorbing magnetic nanoparticles are at a side of the packaging layer far away from the OLED component along a direction perpendicular to the cover plate;
   no water-absorbing magnetic nanoparticle is at other sides of the packaging layer except for the side of the packaging layer far away from the OLED component along the direction perpendicular to the cover plate;
   a region filled by the water-absorbing magnetic nanoparticles in the packaging layer is in contact with the sealant; and
   the packaging layer occupies all regions surrounded by the cover plate, the display substrate and the sealant region, except for a region occupied by the OLED component
   wherein each of the water-absorbing magnetic nanoparticles comprises a core structure and a shell structure, and a material of the core structure is a magnetic metal nanoparticle and a material of the shell structure is a water-absorbing material; or
   each of the water-absorbing magnetic nanoparticles is a nanotube, and the main material of the nanotube is a metallic oxide and is compounded with a water-absorbing material.

2. The display panel according to claim 1, wherein an orthographic projection of the water-absorbing magnetic nanoparticles on the cover plate lies between the orthographic projections of the sealant and the OLED component on the cover plate.

3. The display panel according to claim 1, wherein a particle size of each of the water-absorbing magnetic nanoparticles ranges from 1 nm to 50 nm.

4. The display panel according to claim 1, wherein a volume fraction of the water-absorbing magnetic nanoparticles in the packaging layer material ranges from 10% to 20%.

5. The display panel according to claim 1, wherein the water-absorbing material is calcium oxide or water-absorbing resins.

6. The display panel according to claim 1, wherein the water-absorbing material is calcium oxide or water-absorbing resins.

7. The display panel according to claim 1, wherein the magnetic metal nanoparticle is made of magnetic Au, Al or Mg.

8. The display panel according to claim 1, wherein the metallic oxide is ferric oxide, nickel oxide or cobalt oxide.

9. A fabricating method of the display panel according to claim 1, comprising:
   forming a sealant in a sealant region of a display substrate or a cover plate to be packaged, wherein an OLED component is arranged in a display region of the display substrate;
   coating a packaging layer material in a region surrounded by the sealant, wherein the packaging layer material comprises water-absorbing magnetic nanoparticles;
   aligning the display substrate and the cover plate, and applying a magnetic field to induce the water-absorbing magnetic nanoparticles to move along a direction perpendicular to the cover plate to a side far away from the OLED component; and
   curing the sealant and the packaging layer material.

10. The method according to claim 9, further comprising:
    removing the magnetic field after curing the sealant and the packaging layer material; or
    removing the magnetic field before curing the sealant and the packaging layer material.

11. The method according to claim 10, wherein the removing the magnetic field before curing the sealant and the packaging layer material comprises:
    weakening the magnetic field step by step.

12. The method according to claim 11, wherein the weakening the magnetic field step by step comprises:
    weakening the magnetic field by a preset percentage of an initial value of the magnetic field each time and maintaining it for a preset period of time, until the magnetic field is completely removed.

13. The method according to claim 9, wherein the applying the magnetic field to induce the water-absorbing magnetic nanoparticles to move along the direction perpendicular to the cover plate to the side far away from the OLED component comprises:
    applying a magnetic field departing from the OLED component along a direction perpendicular to the cover plate to induce the water-absorbing magnetic nanoparticles to move to the side far away from the OLED component.

14. A fabricating method of the display panel according to claim 1, comprising:
    forming a sealant in a sealant region of a display substrate or a cover plate to be packaged, wherein an OLED component is arranged in a display region of the display substrate;
    coating a packaging layer material in a region surrounded by the sealant, wherein the packaging layer material comprises water-absorbing magnetic nanoparticles;
    aligning the display substrate and the cover plate, and applying a magnetic field to induce the water-absorbing magnetic nanoparticles to move along an extension direction of the packaging layer to a periphery of a region in which the OLED component is located; and
    curing the sealant and the packaging layer material.

15. A fabricating method of the display panel according to claim 1, comprising:
    forming a sealant in a sealant region of a display substrate or a cover plate to be packaged, wherein an OLED component is arranged in a display region of the display substrate;
    coating a packaging layer material in a region surrounded by the sealant, wherein the packaging layer material comprises water-absorbing magnetic nanoparticles;
    applying a magnetic field to induce the water-absorbing magnetic nanoparticles to move along a direction perpendicular to the cover plate to a side far away from the OLED component, and then aligning the display substrate and the cover plate; and curing the sealant and the packaging layer material.

16. A fabricating method of the display panel according to claim 1, comprising:

forming a sealant in a sealant region of a display substrate or a cover plate to be packaged, wherein an OLED component is arranged in a display region of the display substrate;

coating a packaging layer material in a region surrounded by the sealant, wherein the packaging layer material comprises water-absorbing magnetic nanoparticles;

applying a magnetic field to induce the water-absorbing magnetic nanoparticles to move along an extension direction of the packaging layer to a periphery of a region in which the OLED component is located, and then aligning the display substrate and the cover plate; and curing the sealant and the packaging layer material.

\* \* \* \* \*